(12) United States Patent
Xiao et al.

(10) Patent No.: US 9,006,055 B2
(45) Date of Patent: Apr. 14, 2015

(54) HIGH VOLTAGE FINFET STRUCTURE

(71) Applicants: Han Xiao, Singapore (SG); Shaoqiang Zhang, Singapore (SG); Sanford Chu, Singapore (SG); Liming Li, Shanghai (CN)

(72) Inventors: Han Xiao, Singapore (SG); Shaoqiang Zhang, Singapore (SG); Sanford Chu, Singapore (SG); Liming Li, Shanghai (CN)

(73) Assignee: Globalfoundries Singapore Pte. Ltd., Singapore (SG)

( * ) Notice: Subject to any disclaimer, the term of this patent is extended or adjusted under 35 U.S.C. 154(b) by 73 days.

(21) Appl. No.: 13/754,065

(22) Filed: Jan. 30, 2013

(65) Prior Publication Data

US 2014/0210009 A1    Jul. 31, 2014

(51) Int. Cl.
*H01L 21/00*   (2006.01)
*H01L 29/66*   (2006.01)
*H01L 29/78*   (2006.01)

(52) U.S. Cl.
CPC ...... *H01L 29/66795* (2013.01); *H01L 29/7855* (2013.01)

(58) Field of Classification Search
None
See application file for complete search history.

(56) References Cited

U.S. PATENT DOCUMENTS

| | | | |
|---|---|---|---|
| 2009/0001463 A1* | 1/2009 | Lenoble | 257/344 |
| 2011/0006369 A1 | 1/2011 | Sonsky et al. | |
| 2013/0277683 A1* | 10/2013 | Then et al. | 257/76 |

* cited by examiner

*Primary Examiner* — Charles Garber
*Assistant Examiner* — Evren Seven
(74) *Attorney, Agent, or Firm* — Ditthavong & Steiner, P.C.

(57) ABSTRACT

Methods for forming FIN-shaped field effect transistors (FINFETs) capable of withstanding high voltage applications and the resulting devices are disclosed. Embodiments include forming a source and a drain on a substrate, forming a thin body (FIN) on the substrate and connecting the source and the drain, forming a gate over top and side surfaces of a first part of the FIN, thereby defining a drain-side FIN region of the FIN between the gate and the drain, and forming a shielding region over top and side surfaces of a second part of the FIN in the drain-side FIN region.

17 Claims, 15 Drawing Sheets

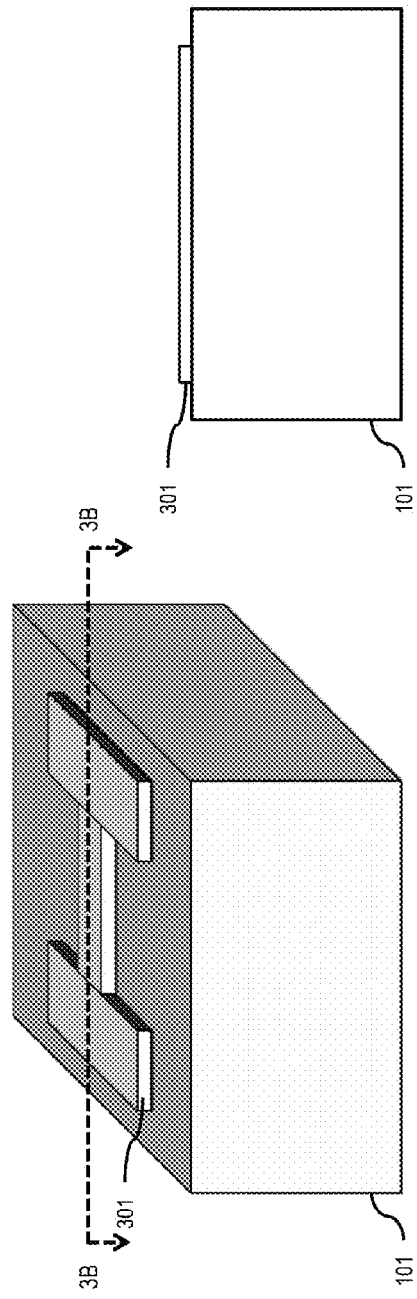

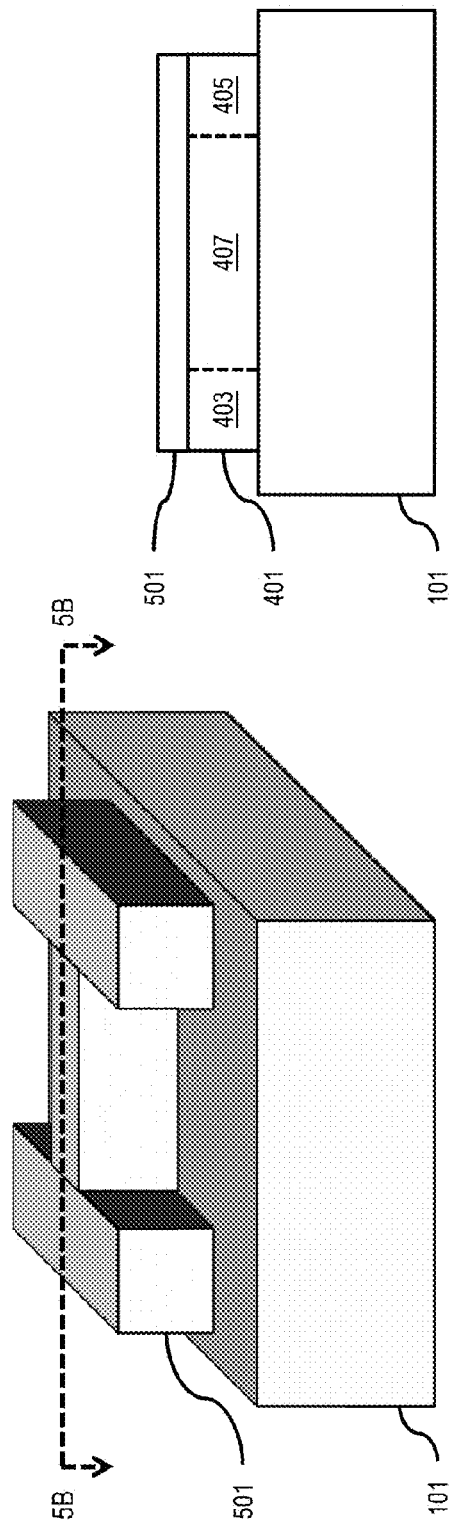

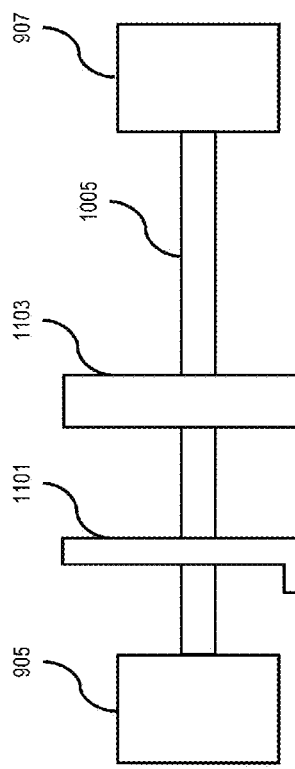
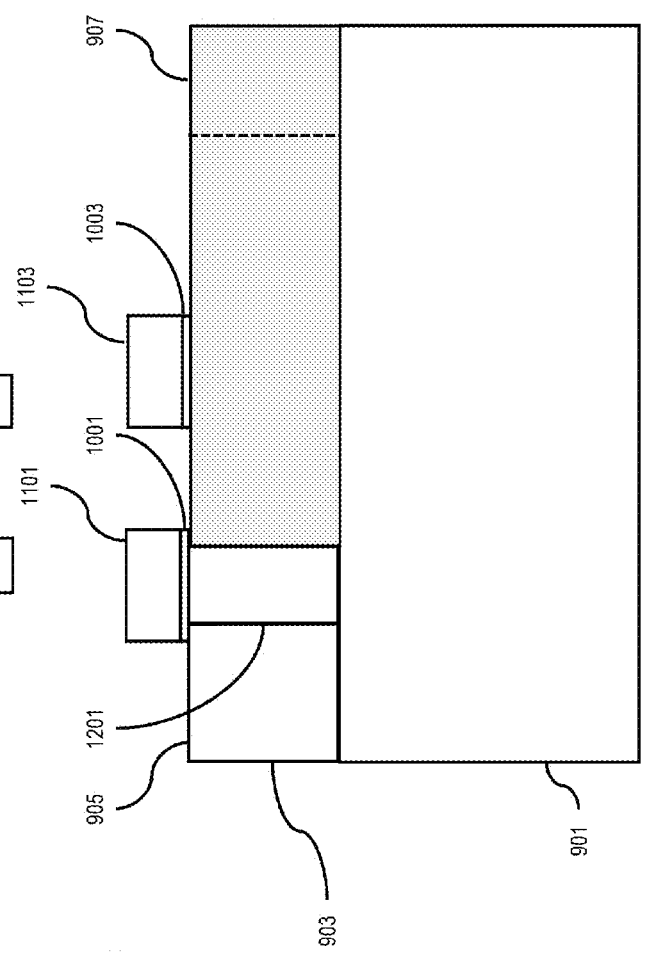
FIG. 12A
FIG. 12B

HIGH VOLTAGE FINFET STRUCTURE

TECHNICAL FIELD

The present disclosure relates to FIN-shaped field effect transistors (FINFETs). The present disclosure is particularly applicable to forming high voltage FINFETs for 22 nanometer (nm) technology nodes and beyond.

BACKGROUND

FINFETs feature a thin body, or FIN, of silicon (Si) formed on a bulk Si or silicon-on-insulator (SOI) substrate and controlled by two gates or surrounded by a gate. With such a design, the body is well controlled and short channel effect is suppressed. As a result, FINFETs are suitable for device dimension scaling and are regarded as a vertical or three-dimensional solution to replace planar metal oxide semiconductor field effect transistors (MOSFETs). Indeed, FINFETs are regarded as the structural solution for sub-22 nm technology because of their scalability and gate control.

High voltage devices are required in integrated circuits for liquid crystal display (LCD) driver applications and power management applications. However, FINFETs are typically used for low voltage and/or low power applications. Risks for high voltage applications include drain endurance, device reliability, and gate-induced drain leakage. Unlike planar laterally diffused metal oxide semiconductor (LDMOS) devices that may have improved voltage endurance and reliability by including a shallow trench isolation (STI) region in the drift region, it is difficult to introduce STI structures into FINFETs because of the thin FIN. As a result, a high electric field region exists at the gate edge for high voltage applications, which becomes the weak point of the FINFET structure. While the gate stack region may be optimized to reduce the gate field and increase reliability, issues still exist. Thus, it would be beneficial to extend the high voltage capability to FINFET devices and process design to integrate high voltage and standard voltage circuitry in the same system and manufacturing process.

A need therefore exists for methodology enabling formation of FINFETs suitable for high voltage/high power applications and the resulting devices.

SUMMARY

An aspect of the present disclosure is an efficient method for fabricating FINFETs with shielding regions covering a drain-side FIN region and/or stepped dielectric layer in the gate stack.

Another aspect of the present disclosure is a FINFET with a shielding region covering a drain-side FIN region and/or stepped dielectric layer in the gate stack.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a source and a drain on a substrate; forming a thin body (FIN) on the substrate and connecting the source and the drain; forming a gate over top and side surfaces of a first part of the FIN, thereby defining a drain-side FIN region of the FIN between the gate and the drain; and forming a shielding region over top and side surfaces of a second part of the FIN in the drain-side FIN region.

Aspects of the present disclosure include forming a first dielectric layer over the top and the side surfaces of the first part of the FIN prior to forming the gate, and forming a second dielectric layer over the top and the side surfaces of the second part of the FIN prior to forming the shielding region, with the second dielectric layer being thicker than the first dielectric layer. Another aspect includes forming one or more additional shielding regions over top and side surfaces of the FIN in the drain-side FIN region between the first shielding region and the drain. Yet another aspect includes independently biasing the first shielding region and the one or more additional shielding regions. Still another aspect includes shorting together the shielding region and the one or more additional shielding regions. Further aspects include forming one or more dielectric layers over top and side surfaces of respective portions of the FIN prior to forming the one or more additional shielding regions, with the one or more dielectric layers having thicknesses different from the first dielectric layer. An additional aspect includes implanting a dopant in the substrate within the drain-side FIN region below the shielding region, the dopant being of a type that is opposite a type of dopant used in doping the drain-side FIN region, forming a reverse implant region. A further aspect includes the shielding region forming a second gate, and the second gate being floating, separately biased, grounded or shorted with the first gate. Another aspect includes the first gate and the second gate being made of different gate materials.

Another aspect of the present disclosure is a device including: a substrate; a source and a drain on the substrate; a FIN on the substrate and connecting the source and the drain; a gate over top and side surfaces of a first part of the FIN and defining a drain-side FIN region of the FIN between the gate and the drain; and a shielding region over top and side surfaces of a second part of the FIN in the drain-side FIN region.

Aspects include a first dielectric layer between the gate and the first part of the FIN, and a second dielectric layer between the shielding region and the second part of the FIN, with the second dielectric layer being thicker than the first dielectric layer. An additional aspect includes one or more additional shielding regions over top and side surfaces of the FIN in the drain-side FIN region between the shielding region and the drain. Another aspect includes the shielding region and the one or more additional shielding regions being independent-biased. A further aspect includes the shielding region and the one or more additional shielding regions being shorted together. Yet another aspect includes one or more dielectric layers respectively between the one or more additional shielding regions and the FIN, the one or more dielectric layers having thicknesses different from the first dielectric layer. An additional aspect includes a reverse implant region in the substrate within the drain-side FIN region below the shielding region. An aspect also includes the shielding region forming a second gate, with the second gate being floating, separately biased, grounded or shorted with the first gate. Another aspect includes the first gate and the second gate being formed of different gate materials.

According to the present disclosure, additional technical effects may be achieved in part by a method including: forming a source and a drain on a substrate; forming a FIN on the substrate and connecting the source and the drain; forming a first dielectric layer of a first thickness over top and side surfaces of a first part of the FIN; forming a second dielectric layer of a second thickness over top and side surfaces of a second part of the FIN, wherein the second thickness is greater than the first thickness and adjacent side surfaces of the first dielectric layer and the second dielectric layer are contiguous thereby forming a stepped dielectric layer; and forming a gate over the stepped dielectric layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which:

FIGS. 1A through 8A and 1B through 8B schematically illustrate three-dimensional and cross-sectional views, respectively, of a method for forming a FINFET structure suitable for high voltage applications with a stepped dielectric layer in the gate stack, in accordance with an exemplary embodiment; and FIGS. 9 through 15 schematically illustrate a method for forming an alternative FINFET structure suitable for high voltage applications with a shielding region, in accordance with an exemplary embodiment, with FIGS. 12A and 14A illustrating plan views and FIGS. 12B and 14B illustrating cross-sectional views.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of the incompatibility of FINFETs with high voltage applications. In accordance with embodiments of the present disclosure, FINFETs are formed with shielding regions covering drain-side FIN regions and/or stepped dielectric layers in the gate stacks, thereby forming FINFETs that are capable of handling high voltage applications.

Methodology in accordance with embodiments of the present disclosure includes forming a source and a drain, and a FIN between and connecting the source and the drain, on a substrate. Next, a first dielectric layer having a first thickness is formed over top and side surfaces of a first part of the FIN. Then, a second dielectric layer having a second thickness is formed over top and side surfaces of a second part of the FIN, wherein the second thickness is greater than the first thickness and adjacent side surfaces of the first dielectric layer and the second dielectric layer are contiguous thereby forming a stepped dielectric layer. A gate is then formed over the stepped dielectric layer.

Methodology in accordance with other embodiments of the present disclosure includes forming a source, a drain and a FIN between and connecting the source and the drain on a substrate. A drain-side FIN region on the FIN is formed by forming a gate over top and side surfaces of a first part of the FIN. A shielding region is then formed over top and side surfaces of a second part of the FIN in the drain-side FIN region. The shielding region improves the field distribution within the drain-side FIN region, thereby producing a FINFET compatible with high voltage applications.

Figure 1B:
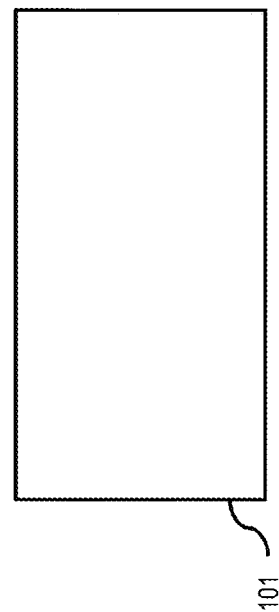
Figure 1A:
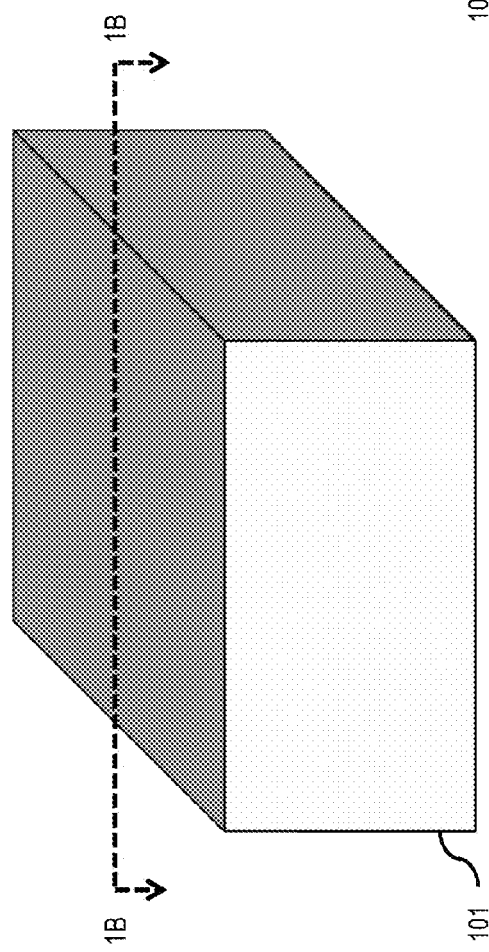

Adverting to FIG. 1A, a method for forming a FINFET capable of withstanding high voltage, according to an exemplary embodiment, begins with a substrate 101 as illustrated in the 3D schematic view. Further, FIG. 1B illustrates a cross section of the substrate 101 along the 1B-1B line illustrated in FIG. 1A. The substrate 101 may be formed of bulk Si or may be SOI.

Figure 2B:
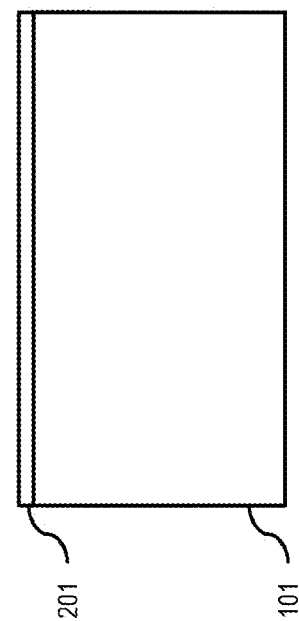
Figure 2A:
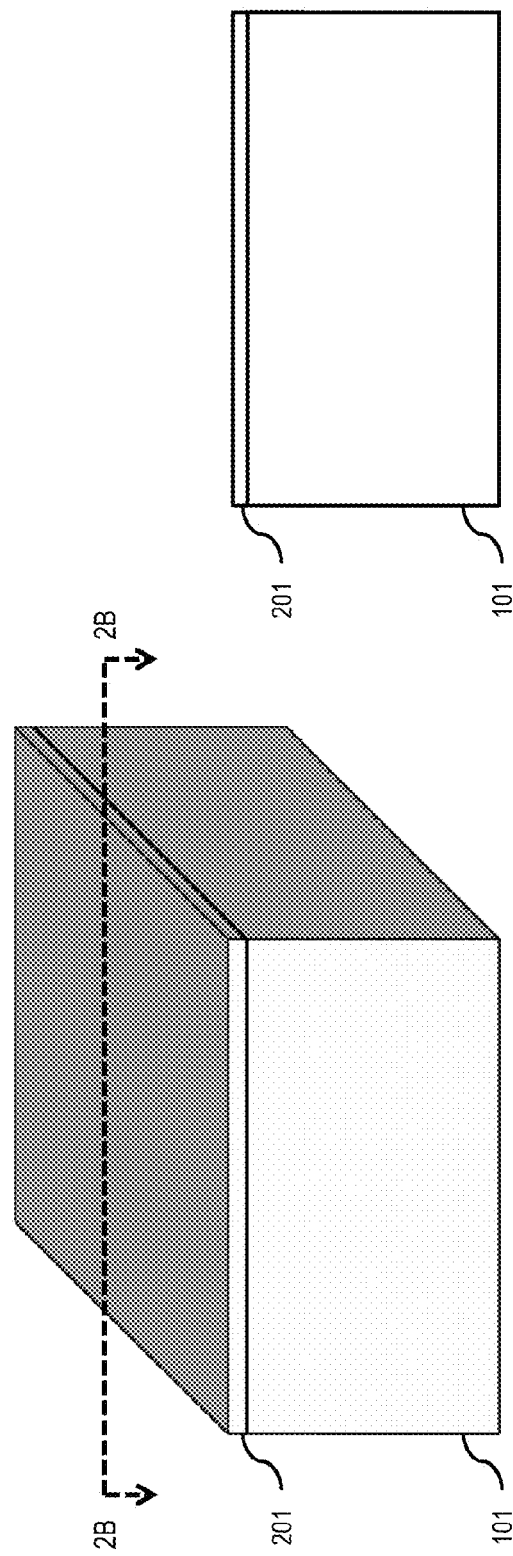

Next, as illustrated in FIGS. 2A and 2B, a hardmask layer 201 may be formed over the substrate 101. The hardmask layer 201 may be formed of any conventional hardmask and is used in etching the substrate 101, as discussed below. Subsequently, the hardmask layer 201 may be patterned to form a patterned hardmask 301, as illustrated in FIGS. 3A and 3B.

Figure 4B:
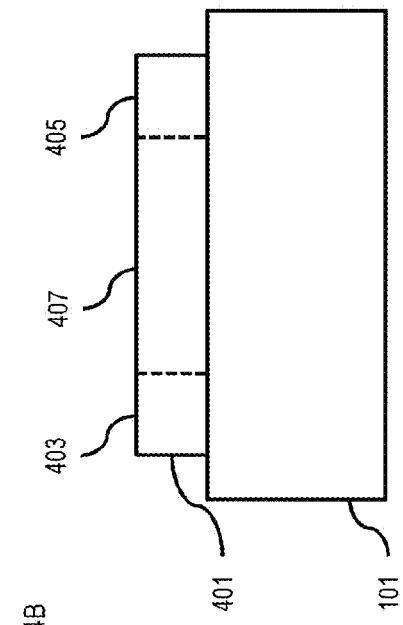
Figure 4A:
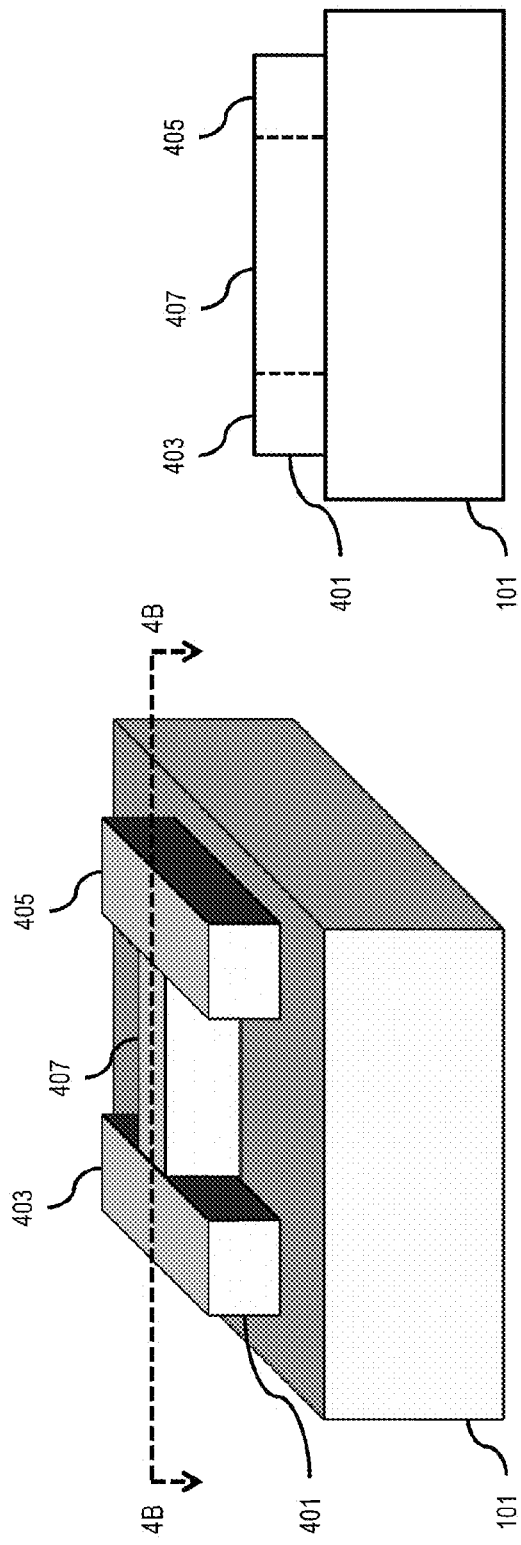

Adverting to FIGS. 4A and 4B, the substrate 101 may be etched after forming the patterned hardmask 301 to define a FIN/active region 401 within the substrate 101. The FIN/active region 401 may include a source region 403, a drain region 405 and a FIN region 407. The FIN region 407 forms a horizontally thin region of the FIN/active region 401 that connects the source region 403 and the drain region 405 and may be of various lengths and thicknesses depending on the application of the resulting FINFET. After etching the substrate 101, the patterned hardmask 301 may be removed, as illustrated in FIGS. 4A and 4B.

Next, a first dielectric layer 501 is formed over the FIN/active region 401, as illustrated in FIGS. 5A and 5B. The first dielectric layer 501 may be formed of any dielectric, such as an oxide, and may be formed to an equivalent oxide thickness of 1 to 20 nm. The first dielectric layer 501 may be formed by growing or depositing dielectric material over the entire FIN/active region 401.

Figures 6A, 6B:
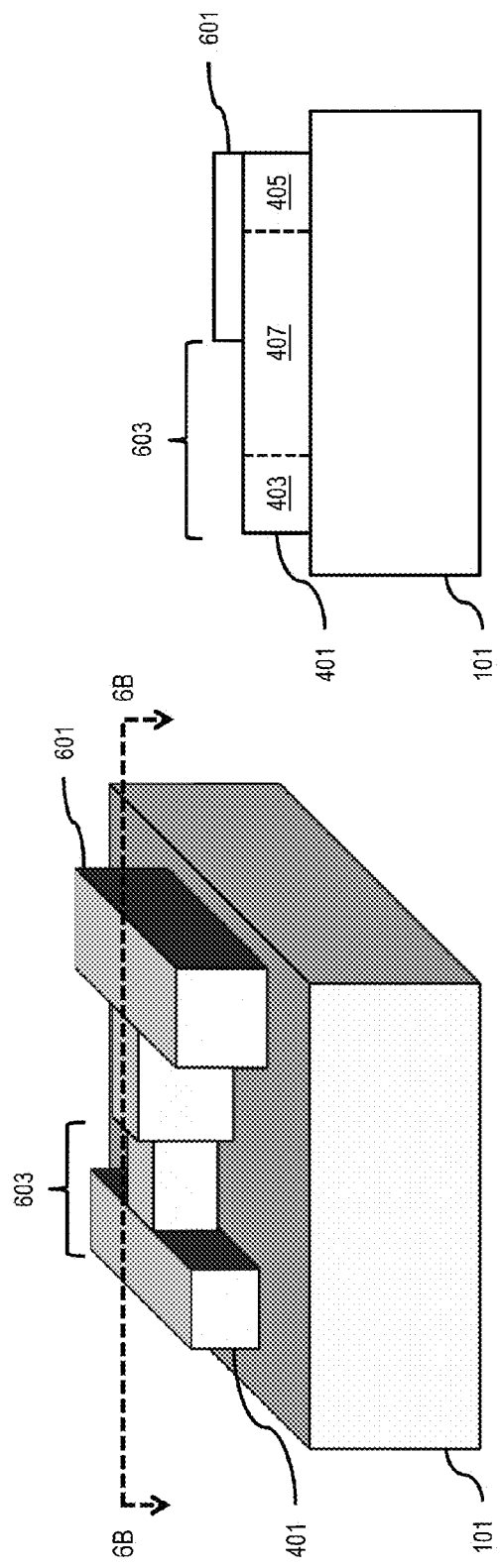

After forming the first dielectric layer 501, a portion of the first dielectric layer 501 formed over the top and side surfaces of the source region 403 and part of the FIN region 407 near the source region 403 is removed, forming a patterned first dielectric layer 601 and exposing a portion 603 of the FIN/active region 401, as illustrated in FIGS. 6A and 6B. The portion of the first dielectric layer 501 may be removed according to any conventional processing.

Figure 7A:
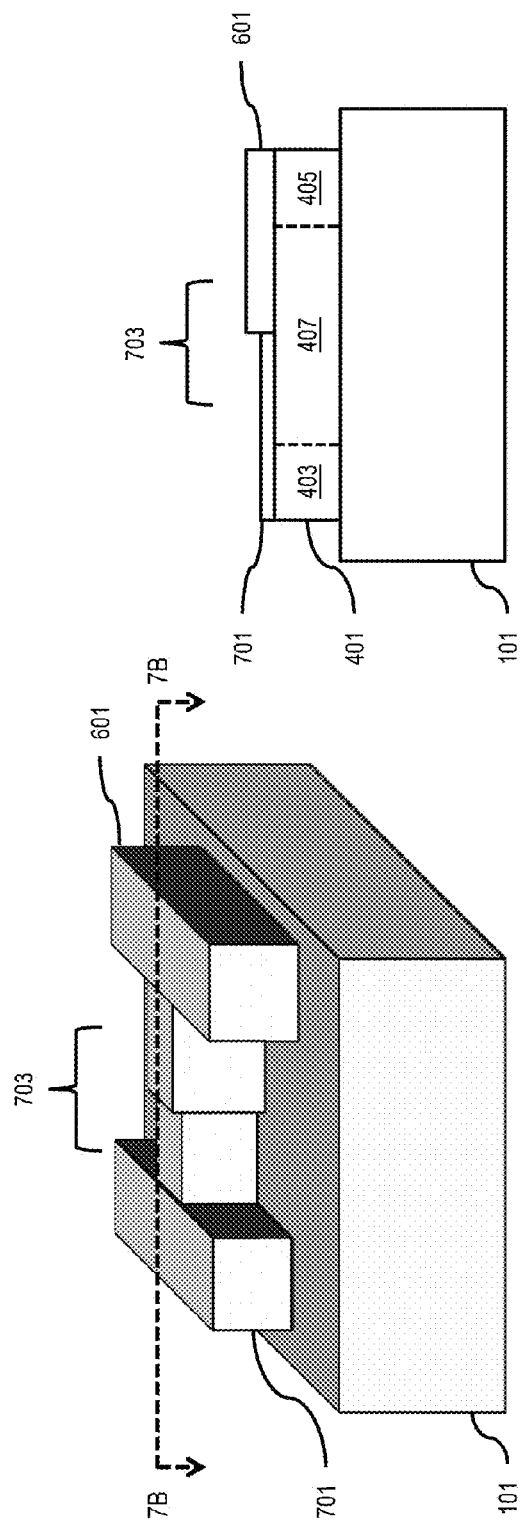
Figure 7B:
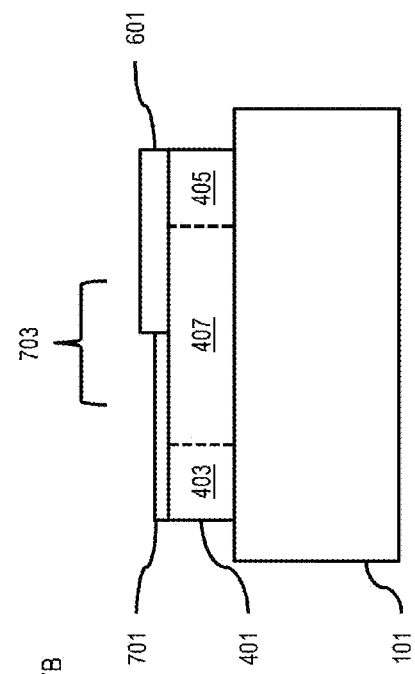

Next, a second dielectric layer 701 is formed over the exposed portion 603 of the FIN/active region 401, as illustrated in FIGS. 7A and 7B. The second dielectric layer 701 may be formed of any dielectric, such as an oxide, and may be formed to an equivalent oxide thickness of 0.5 to 10 nm. Thus, the second dielectric layer 701 is formed to be thinner than the first dielectric layer 501. The second dielectric layer 701 may be formed of the same dielectric material or a different dielectric material than the first dielectric layer 501. Further, the second dielectric layer 701 is formed such that adjacent edges of the second dielectric layer 701 and the first dielectric layer 501 are contiguous, as illustrated in FIG. 7B, thereby forming a stepped dielectric layer 703 over the FIN region 407. By forming the first dielectric layer 501 thicker than the second dielectric layer 701, the stepped dielectric layer 703 is thicker towards the drain region 405, as illustrated in FIG. 7B.

Although the method described above discusses and illustrates the first dielectric layer 501 being formed first, alternatively the second dielectric layer 701 may be formed first and then the first dielectric layer 501. Alternatively, the second dielectric layer 701 may be initially formed over the entire FIN/active region 401 and the first dielectric layer 501 may be formed by adding dielectric over the first dielectric layer 501 on the top and the side surfaces of the drain region 405 side of the FIN region 407 and the drain region 405. Thus, the stepped dielectric layer 703 may be formed according to various approaches.

Figure 8B:
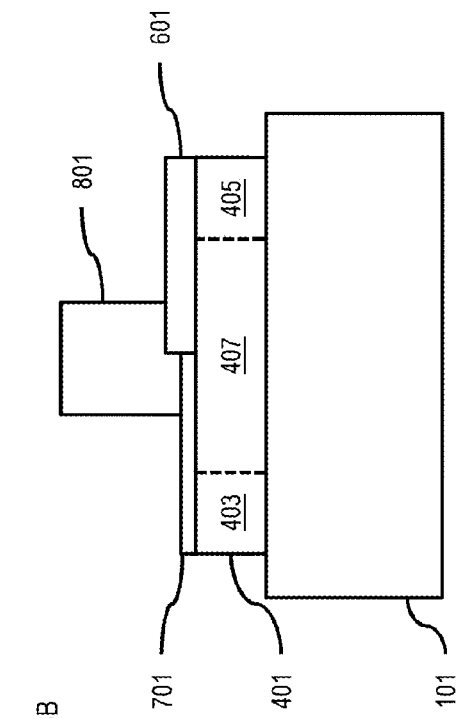
Figure 8A:
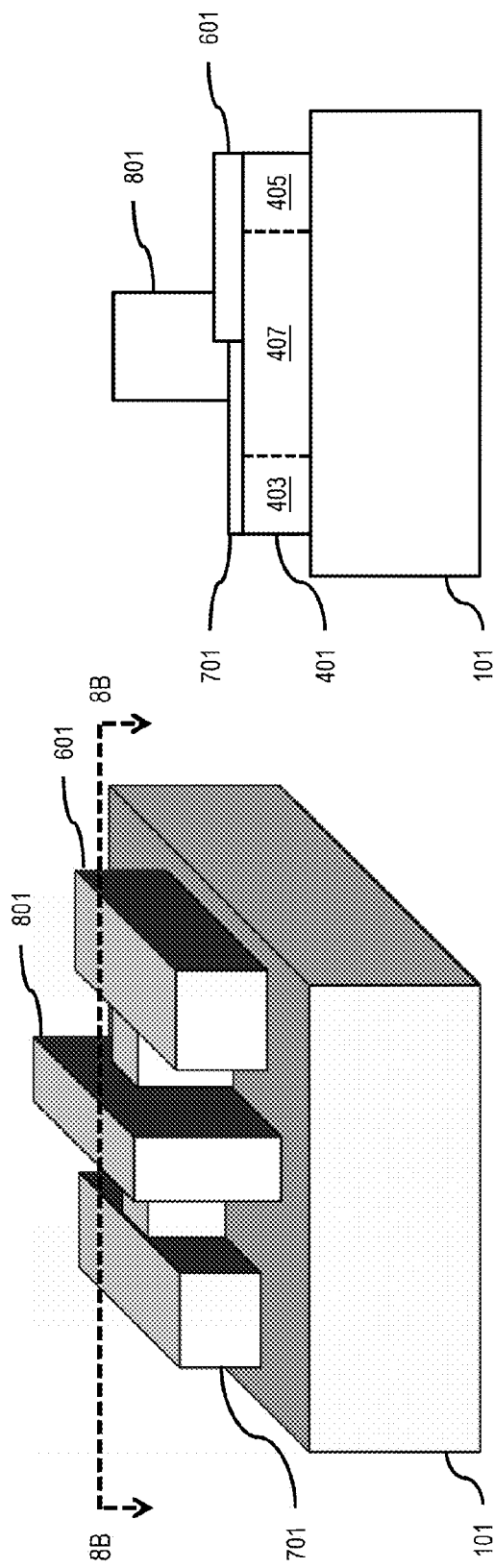

Adverting to FIGS. 8A and 8B, a gate 801 may be formed over the stepped dielectric layer 703. Further, although not shown (for illustrative convenience), additional processing may occur after forming the gate 801, such as implantation of the source region 403 and the drain region 405 to form a source and drain, respectively, and additional back-end-of-the-line (BEOL) processing steps, such as salicidation. By introducing the thicker dielectric layer at the drain side, the peak electric field generated at the gate is reduced, which reduces the gate-induced drain leakage (GIDL) and increases the drain voltage endurance and reliability. As such, the resulting FINFET can withstand high voltage applications, such as applications experiencing 5 to 100 volts (V).

Figure 9:
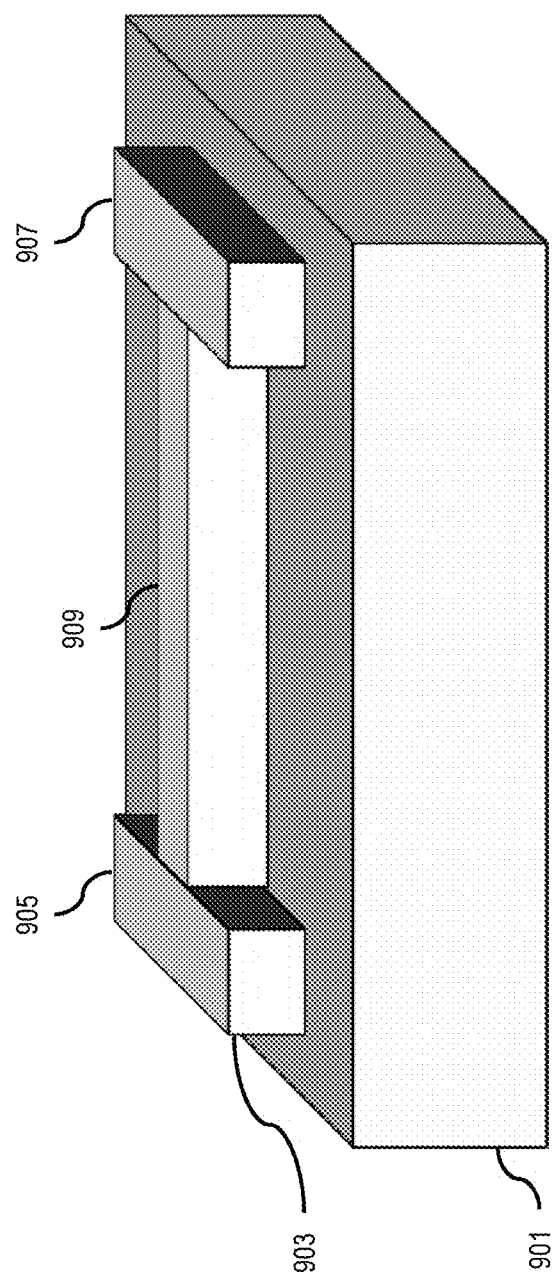

Adverting to FIG. 9, a method for forming a FINFET capable of withstanding high voltage, according to another exemplary embodiment, begins with a substrate 901 etched to define a FIN/active region 903 within the substrate 901, similar to FIG. 4A discussed above. The substrate 901 may be formed of bulk Si or SOI. The FIN/active region 903 may include a source region 905, a drain region 907 and a FIN region 909. The FIN region 909 forms a horizontally thin region of the FIN/active region 903 that connects the source region 905 and the drain region 907 and may be of various lengths and thicknesses depending on the application of the resulting FINFET.

Figure 10:
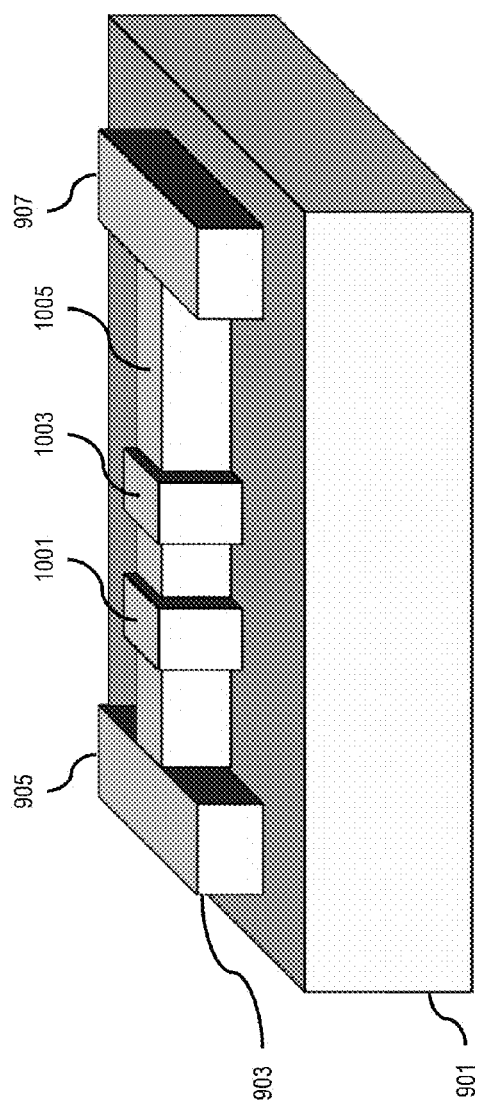

Next, a first dielectric layer 1001 may be formed over top and side surfaces of a portion of the FIN region 909, as illustrated in FIG. 10. The first dielectric layer 1001 may be formed of any dielectric material, such as an oxide, to a thickness of 0.5 to 10 nm. Formation of the first dielectric layer 1001 defines a drain-side FIN region 1005 of the FIN region 909, which may be 10 to 70% of the FIN region. As further illustrated in FIG. 10, a second dielectric layer 1003 may be formed over top and side surfaces of the drain-side FIN region 1005 of the FIN region 909. The second dielectric layer 1003 may be formed of any dielectric material, such as the same or a different oxide used in forming the first dielectric layer 1001, and may be formed to a thickness of 1 to 20 nm. As such, the second dielectric layer 1003 may be formed to the same thickness or thicker than the first dielectric layer 1001.

Figure 11:
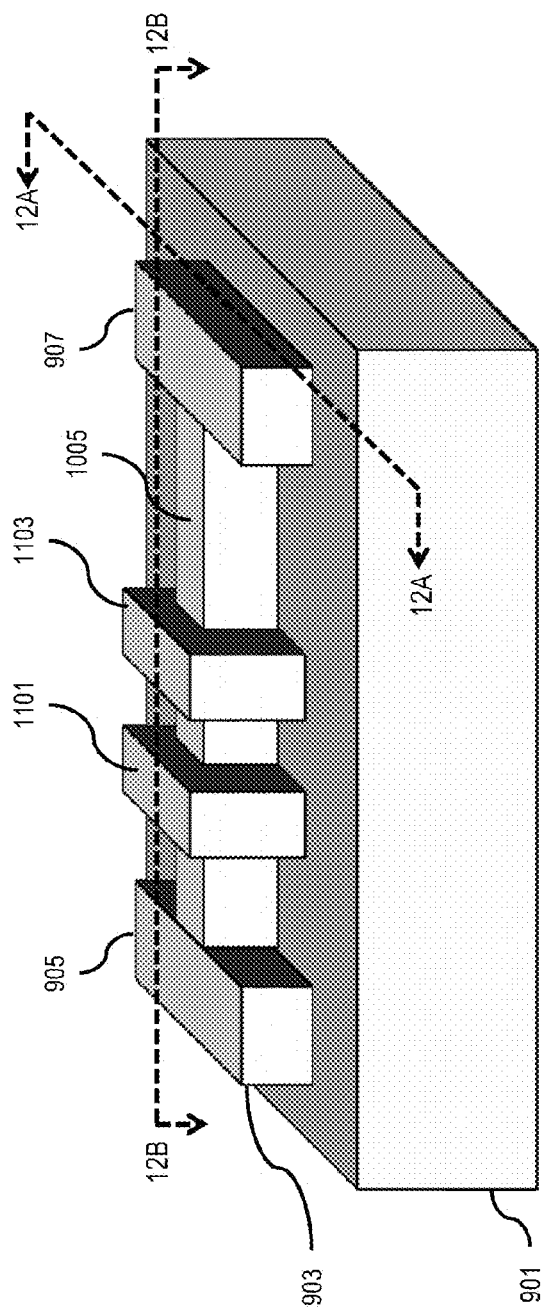

Adverting to FIG. 11, a gate 1101 may be formed over the first dielectric layer 1001. The gate 1101 may be formed of any gate material, such as an N-channel gate material. Further, a shielding region 1103 may be formed over the second dielectric layer 1003 on the drain-side FIN region 1005 of the FIN region 909. The shielding region 1103 may be formed of a gate material, which may be the same or a different material used in forming the gate 1101, such as a P-channel gate material. Where the shielding region 1103 is formed of a gate material, the shielding region 1103 may form a gate that is floating, separately biased, grounded or shorted with the gate 1101. The formation of the drain-side FIN region 1005, in part, may allow the structure to endure high drain voltage. The addition of the shielding region 1103 improves the electric field uniformity and high voltage endurance from the drain region 907 across the drain-side FIN region 1005. Further, the addition of the second dielectric layer 1003 beneath the shielding region 1103 improves the gate voltage endurance.

FIG. 12A illustrates a plan view of the substrate 901 illustrated in FIG. 11 along the line 12A-12A. FIG. 12A includes the source region 905, the drain region 907 and the drain-side FIN region 1005. Also illustrated are the gate 1101 and the shielding region 1103. As illustrated, the shielding region 1103 is closer to the drain region 907 than the gate 1101 is. Further, FIG. 12B illustrates a cross section of the substrate 901 illustrated in FIG. 11 along the line 12B-12B. FIG. 12B includes the FIN/active region 903 above the substrate 901. Within the FIN/active region 903 are the source region 905 and the drain region 907. Above the FIN/active region 903 are the first dielectric layer 1001 and the second dielectric layer 1003, with the gate 1101 above the first dielectric layer 1001 and the shielding region 1103 above the second dielectric layer 1003. Beneath the gate 1101 is a FIN channel 1201.

Figure 13:
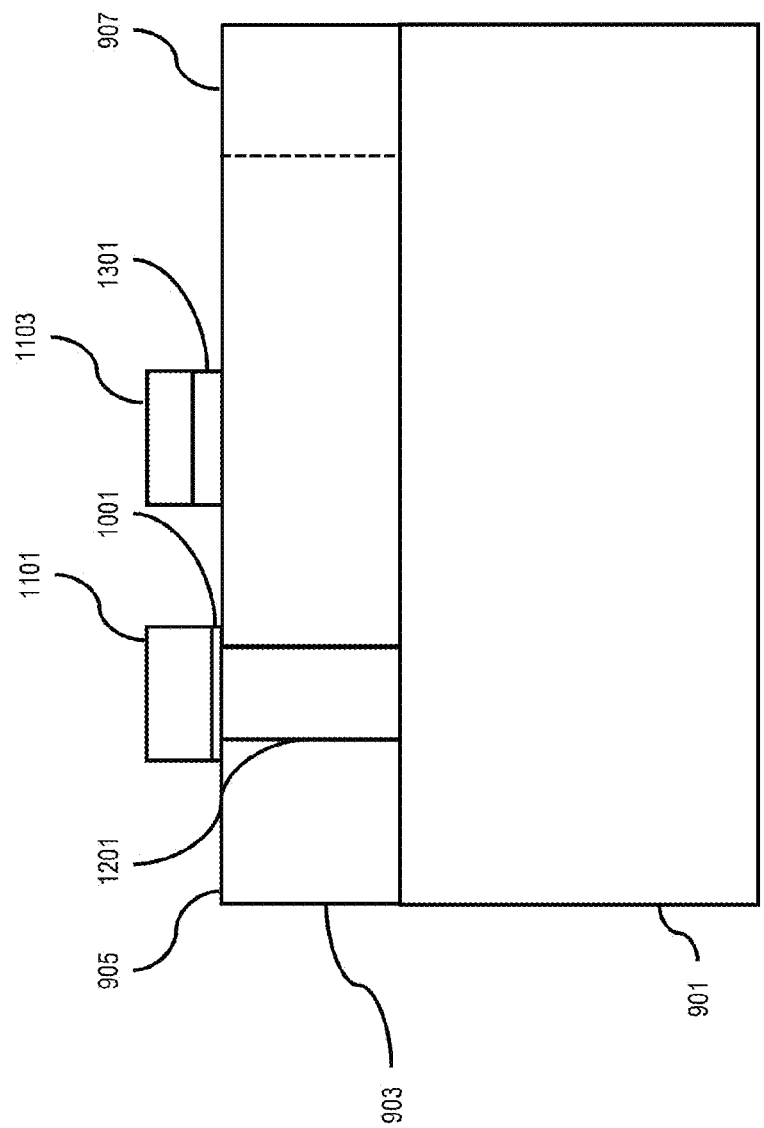

Adverting to FIG. 13, as discussed above, the second dielectric layer 1003 may be thicker than the first dielectric layer 1001. FIG. 13 illustrates the structure 1300, which is similar to the structure 1100 of FIG. 12B except that the structure 1300 includes a thicker second dielectric layer 1301 than the first dielectric layer 1001, as illustrated.

Figure 14:
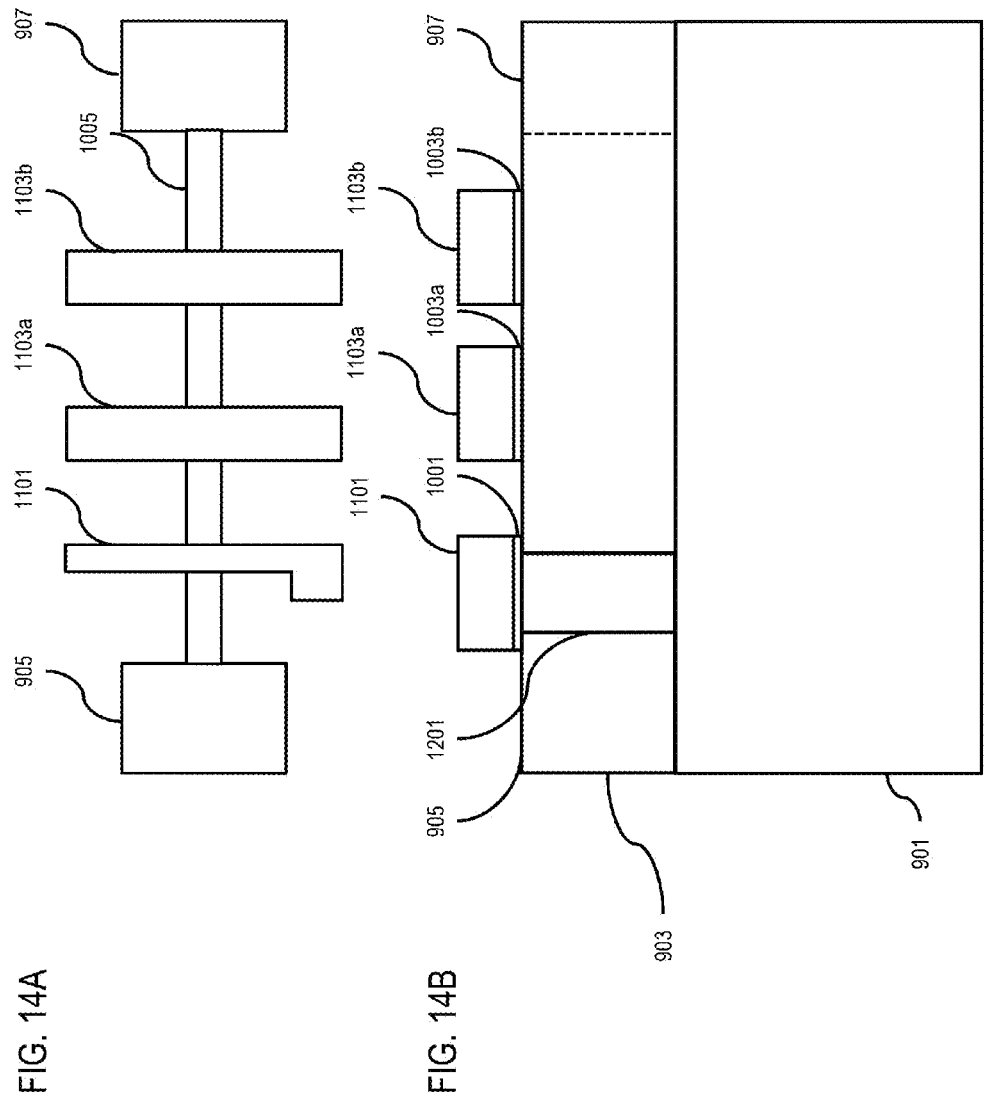

In another exemplary embodiment, there may be more than one shielding region. As illustrated in FIGS. 14A and 14B, there may be two shielding regions 1103a and 1103b (or more) each formed on top and side surfaces of the drain-side FIN region 1005. As further illustrated, each shielding region 1103a and 1103b includes a dielectric layer, as illustrated by dielectric layers 1003a and 1003b. The dielectric layers 1003a and 1003b may be the same thickness or thicker than the first dielectric layer 1001. Further, the dielectric layers 1003a and 1003b may be the same or different thicknesses with respect to each other. Where there is more than one shielding region, the additional shielding regions may be independently biased with respect to the shielding region 1103. Alternatively, the additional shielding regions may be shorted together with the shielding region 1103.

Figure 15:
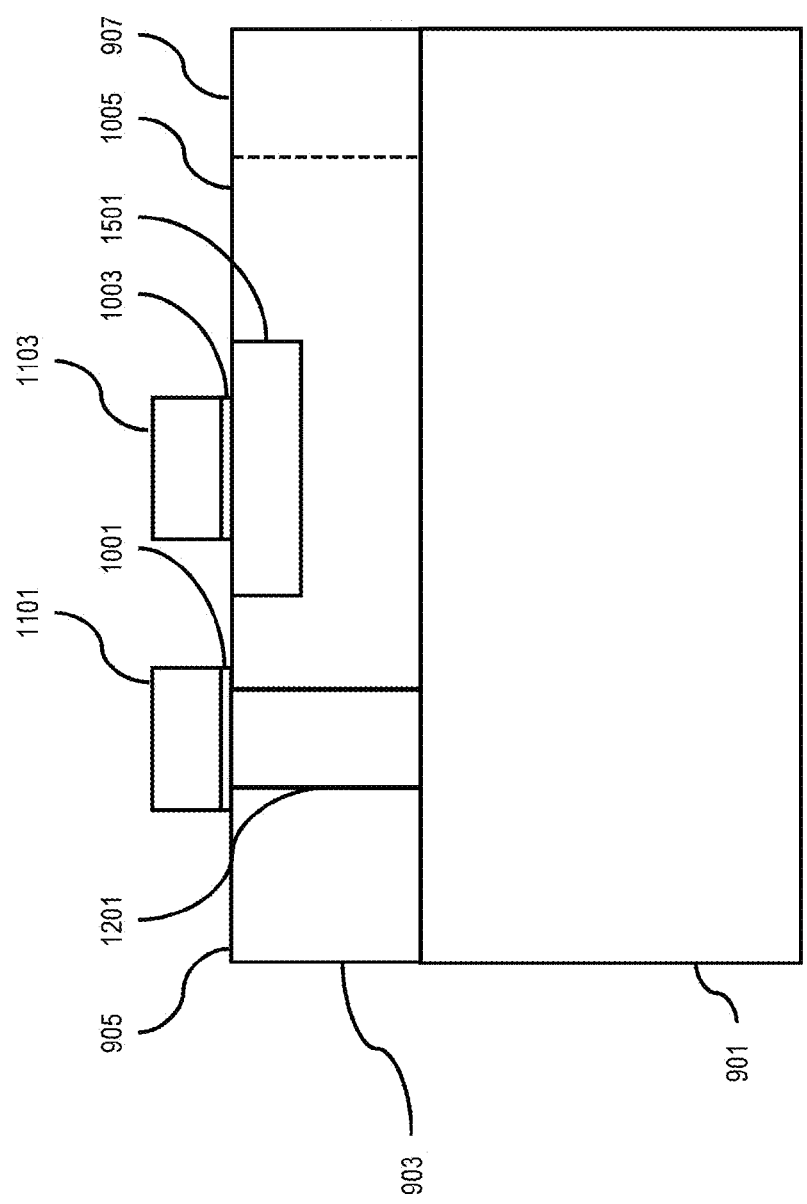

In another exemplary embodiment, the drain-side FIN region 1005 may be lightly doped to endure the high voltage experienced from the drain region 907. Additionally, an implant doping region 1501 may be formed within the drain-side FIN region 1005 below the shielding region 1103, as illustrated in FIG. 15. The implant doping region 1501 may be formed 10 to 100 nm deep into the drain-side FIN region 1005. Thus, prior to forming the second dielectric layer 1003 and the shielding region 1103, a portion of the drain-side FIN region 1005 may be doped to form the implant doping region 1501. The implant doping region 1501 may be doped with a type of dopant that is opposite a type of dopant used in doping the drain-side FIN region 1005.

Although not shown (for illustrative convenience), additional processing may occur after forming the structures illustrated in FIGS. 11 through 15, such as implantation of the source region 905 and the drain region 907, forming the source and drain, respectively, and additional BEOL processing steps. The embodiments illustrated in FIGS. 11 through 15 are suitable for high voltage applications, such as applications experiencing 5 to 100 V, with FINFET compatible processing that is beneficial for system integration and cost-efficiency. The embodiments also include improved electric field uniformity and high voltage endurance. Further, the above-discussed process steps can be realized with FINFET compatible processes by changing the layout design, thus allowing the system integration of high voltage FINFETs.

The embodiments of the present disclosure achieve several technical effects, including FINFETs capable of withstanding high voltage applications that are fully compatible with current FINFET processes and structures allowing for cost-effective integration. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 22 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a source and a drain on a substrate;
   forming a thin body (FIN) on the substrate and connecting the source and the drain;
   forming a gate over top and side surfaces of a first part of the FIN, thereby defining a drain-side FIN region of the FIN between the gate and the drain;
   forming a shielding region over top and side surfaces of a second part of the FIN in the drain-side FIN region;
   forming a first dielectric layer over the top and the side surfaces of the first part of the FIN prior to forming the gate; and
   forming a second dielectric layer over the top and the side surfaces of the second part of the FIN in the drain-side FIN region prior to forming the shielding region,
   wherein the second dielectric layer is thicker than the first dielectric layer.

2. The method according to claim 1, further comprising forming one or more additional shielding regions over top and side surfaces of the FIN in the drain-side FIN region between the first shielding region and the drain.

3. The method according to claim 2, further comprising independently biasing the first shielding region and the one or more additional shielding regions.

4. The method according to claim 2, further comprising shorting together the shielding region and the one or more additional shielding regions.

5. The method according to claim 2, further comprising:
   forming one or more dielectric layers over top and side surfaces of respective portions of the FIN prior to forming the one or more additional shielding regions,
   wherein the one or more dielectric layers have thicknesses different from the first dielectric layer.

6. The method according to claim 1, further comprising implanting a dopant in the substrate within the drain-side FIN region below the shielding region, the dopant being of a type that is opposite a type of dopant used in doping the drain-side FIN region, forming a reverse implant region.

7. The method according to claim 1, wherein the shielding region forms a second gate, and the second gate is floating, separately biased, grounded or shorted with the gate.

8. The device according to claim 7, wherein the gate and the second gate are made of different gate materials.

9. A device comprising:
   a substrate;
   a source and a drain on the substrate;
   a thin body (FIN) on the substrate and connecting the source and the drain;
   a gate over top and side surfaces of a first part of the FIN and defining a drain-side FIN region of the FIN between the gate and the drain;
   a shielding region over top and side surfaces of a second part of the FIN in the drain-side FIN region;
   a first dielectric layer between the gate and the first part of the FIN; and
   a second dielectric layer between the shielding region and the second part of the FIN in the drain-side FIN region,
   wherein the second dielectric layer is thicker than the first dielectric layer.

10. The device according to claim 9, further comprising one or more additional shielding regions over top and side surfaces of the FIN in the drain-side FIN region between the shielding region and the drain.

11. The device according to claim 10, comprising the shielding region and the one or more additional shielding regions being independent-biased.

12. The device according to claim 10, comprising the shielding region and the one or more additional shielding regions being shorted together.

13. The device according to claim 10, further comprising one or more dielectric layers respectively between the one or more additional shielding regions and the FIN, the one or more dielectric layers having thicknesses different from the first dielectric layer.

14. The device according to claim 9, further comprising a reverse implant region in the substrate within the drain-side FIN region below the shielding region.

15. The device according to claim 9, wherein the shielding region forms a second gate, and the second gate is floating, separately biased, grounded or shorted with the gate.

16. The device according to claim 15, wherein the gate and the second gates are formed of different gate materials.

17. A method comprising:
   forming a source and a drain on a substrate;
   forming a thin body (FIN) on the substrate and connecting the source and the drain;
   forming a first dielectric layer of a first thickness over top and side surfaces of a first part of the FIN;
   forming a second dielectric layer of a second thickness over top and side surfaces of a second part of the FIN, the second part of the FIN located between the first dielectric layer and the drain, the second part of the FIN constituting a drain side-FIN region, wherein the second thickness is greater than the first thickness and adjacent side surfaces of the first dielectric layer and the second dielectric layer are contiguous thereby forming a stepped dielectric layer; and
   forming a gate over the stepped dielectric layer.

* * * * *